United States Patent
Sakaue et al.

(10) Patent No.: US 9,443,602 B2
(45) Date of Patent: Sep. 13, 2016

(54) STORAGE DEVICE AND DATA LATCH TIMING ADJUSTMENT METHOD

(71) Applicant: Kabushiki Kaisha Toshiba, Minato-ku (JP)

(72) Inventors: Kenji Sakaue, Yokohama (JP); Edward Bandy Samigat, Yokohama (JP); Atsushi Takayama, Yokohama (JP); Yutaka Tango, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 209 days.

(21) Appl. No.: 14/093,190

(22) Filed: Nov. 29, 2013

(65) Prior Publication Data
US 2015/0058705 A1 Feb. 26, 2015

Related U.S. Application Data

(60) Provisional application No. 61/869,376, filed on Aug. 23, 2013.

(51) Int. Cl.
| | |
|---|---|
| H03M 13/00 | (2006.01) |
| G11C 16/32 | (2006.01) |
| G06F 13/16 | (2006.01) |
| G11C 7/10 | (2006.01) |
| H03M 13/09 | (2006.01) |
| H03M 13/15 | (2006.01) |

(52) U.S. Cl.
CPC ........... *G11C 16/32* (2013.01); *G06F 13/1689* (2013.01); *G11C 7/106* (2013.01); *G11C 7/1066* (2013.01); *H03M 13/09* (2013.01); *H03M 13/152* (2013.01); *H03M 13/1515* (2013.01)

(58) Field of Classification Search
CPC ..... G11C 29/023; G11C 16/32; G06F 11/10; H03M 13/09; H03M 13/6312; H03M 13/152; H03M 13/1515; G01R 31/31726; G01R 31/3191; G01R 31/31937
See application file for complete search history.

(56) References Cited

U.S. PATENT DOCUMENTS

| | | | | |
|---|---|---|---|---|
| 6,215,726 | B1 | 4/2001 | Kubo | |
| 6,466,491 | B2 * | 10/2002 | Yanagawa | ...................... 365/194 |
| 7,430,143 | B2 * | 9/2008 | Choi | .............................. 365/194 |
| 7,639,540 | B2 | 12/2009 | Kim et al. | |
| 8,145,925 | B2 | 3/2012 | Oh | |
| 2009/0284290 | A1 * | 11/2009 | Kuroki et al. | ................. 327/158 |

FOREIGN PATENT DOCUMENTS

| | | |
|---|---|---|
| JP | 4397076 | 10/2009 |
| JP | 2010-518547 | 5/2010 |
| JP | 2011-507140 | 3/2011 |
| JP | 2012-37973 | 2/2012 |

* cited by examiner

*Primary Examiner* — Shelly A Chase
(74) *Attorney, Agent, or Firm* — Oblon, McClelland, Maier & Neustadt, L.L.P.

(57) ABSTRACT

According to one embodiment, a storage device includes a storage medium, a DLL circuit, a latch circuit, and a delay amount adjustment circuit. The DLL circuit gives a predetermined amount of delay to an inputted clock signal, the latch circuit latches data outputted from the storage medium in accordance with the clock signal delayed in the DLL circuit, the delay amount adjustment circuit adjusts the delay amount that the DLL circuit is to give to the clock signal based on a latch result by the latch circuit.

19 Claims, 4 Drawing Sheets

US 9,443,602 B2

STORAGE DEVICE AND DATA LATCH TIMING ADJUSTMENT METHOD

CROSS-REFERENCE TO RELATED APPLICATIONS

This application is based upon and claims the benefit of priority from U.S. Provisional Application No. 61/869,376, filed on Aug. 23, 2013; the entire contents of which are incorporated herein by reference.

FIELD

Embodiments described herein relate generally to a storage device and a data latch timing adjustment method.

BACKGROUND

In a case where a data read request is received externally, NAND type flash memory (hereinbelow, NAND memory) that is one of storage devices synchronizes requested data (read data) with a data latch signal (clock signal that becomes a reference of timing to latch data) and outputs the same. In a memory controller, a predetermined amount of delay is added to the data latch signal imputed from the NAND memory, and data is latched at timing that is synchronized with the data latch signal after the addition of the delay (hereinbelow referred to as a delayed data latch signal). For example, the data is latched at a rising edge of the delayed data latch signal. Further, a toggle mode by which the data can be read at faster speed also exists. In the toggle mode, the data is latched at both edges (rising edge and trailing edge) of the delayed data latch signal. A conventional memory controller includes a delay element, and the delay element generates a delayed data latch signal by delaying the data latch signal by a fixed delay amount that is predetermined set.

Data transfer speed of the NAND memory is becoming faster than ever, and accompanying this, a valid period during which read data can be latched is becoming shorter. Due to this, it is gradually becoming difficult to preset the delay amount to be given to the data latch signal and generate the delayed data latch signal by the delay element giving delay to the data latch signal. That is, even if the delay amount is set upon production, the delay time of the delay element changes by a peripheral temperature and operation voltage fluctuation and the like of an apparatus that installs the NAND memory, and a possibility that the read data cannot be latched within the valid period (not being able to correctly read data) is growing.

DETAILED DESCRIPTION

According to one embodiment, a storage device includes a storage medium, a DLL circuit, a latch circuit, and a delay amount adjustment circuit. The DLL circuit gives a predetermined amount of delay to an inputted clock signal, the latch circuit latches data outputted from the storage medium in accordance with the clock signal delayed in the DLL circuit, the delay amount adjustment circuit adjusts the delay amount that the DLL circuit is to give to the clock signal based on a latch result by the latch circuit.

Hereinbelow, a storage device and a data latch timing adjustment method of embodiments will be described in detail with reference to the attached drawings. However, the invention is not limited by these embodiments.

First Embodiment

Figure 1:
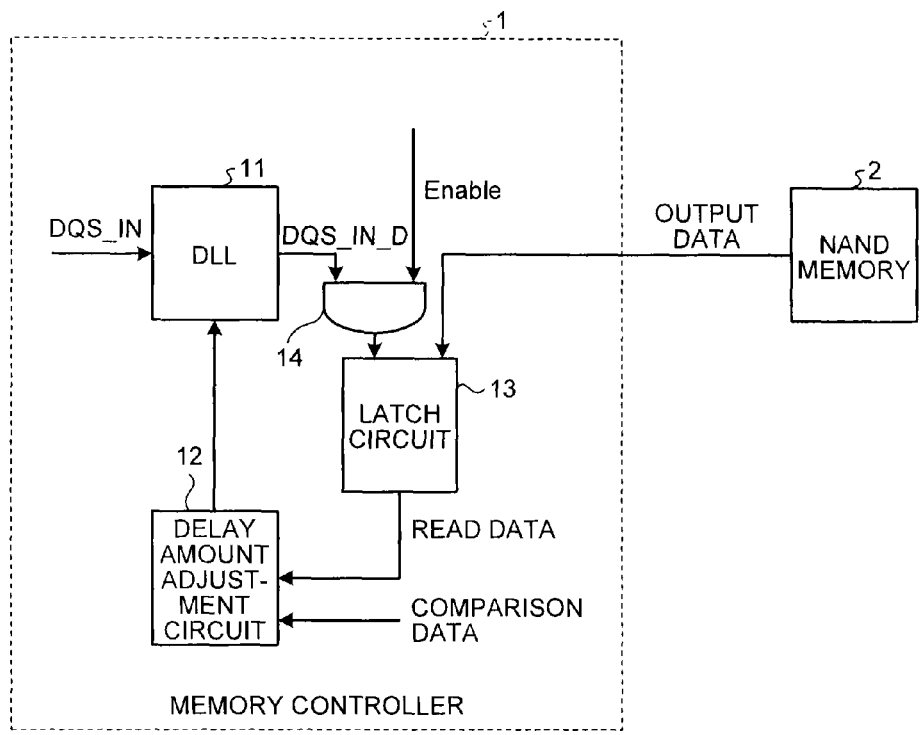
FIG. 1 is a diagram illustrating a configuration example of a storage device of a first embodiment.

FIG. 1 is a diagram illustrating a configuration example of a storage device of the first embodiment. The storage device includes a memory controller 1 and NAND type flash memory (hereinbelow, NAND memory). The memory controller 1 is configured by including a delay circuit (DLL: Delay Locked Loop) 11, a delay amount adjustment circuit 12, a latch (LATCH) circuit 13, and an AND circuit 14. By the way, in FIG. 1, configuration elements related to data readout from the NAND memory 2 are described, and descriptions of other configuration elements are omitted.

In a case of reading data, the memory controller 1 sends a data read request command from a command output section that is not illustrated to the NAND memory 2, and when the data corresponding to the command is outputted, the data is latched at an appropriate timing. In a case where the latching of the data is not carried out appropriately and the data cannot be read correctly, the memory controller 1 makes adjustments so that the latch timing of data becomes appropriate. An adjustment method will be described later.

The DLL 11 receives a clock signal that is generated inside or outside the memory controller 1 as a data latch signal (DQS_IN signal), and delays the received DQS_IN signal by a delay amount determined by the delay amount adjustment circuit 12. Further, it outputs the delayed DQS_IN signal as a DQS_IN_D signal. The delay amount adjustment circuit 12 confirms whether the data outputted from the NAND memory 2 can be read correctly (whether the data can be latched at the appropriate timing), and adjusts the delay amount that the DLL 11 gives to the DQS_IN signal in a case where the readout of the data is not carried out appropriately. The latch circuit 13 latches the output data from the NAND memory 2 at the timing according to the DQS_IN_D signal that is outputted from the DLL 11 and inputted via the AND circuit 14. The AND circuit 14 executes AND calculation of the DQS_IN_D signal and an Enable signal. Here, the Enable signal is for example outputted from the controller control section that is not illustrated. The Enable signal becomes a High level in the case of reading data from the NAND memory 2. That is, the DQS_IN_D signal is configured to be inputted to the latch circuit 13 in the case where the NAND memory 2 outputs data.

Figure 2:
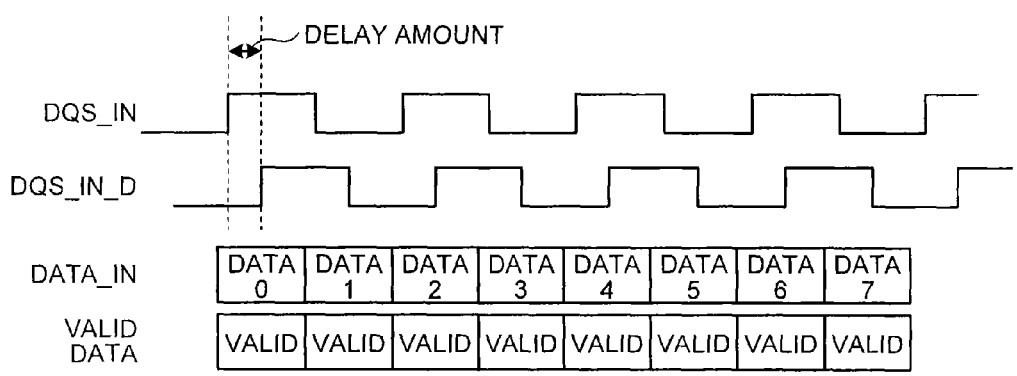
FIG. 2 is a timing chart illustrating a relationship of a DQS_IN signal, a DQS_IN_D signal, and a DATA_IN signal.

FIG. 2 is a timing chart illustrating a relationship of the DQS_IN signal, the DQS_IN_D signal, and a DATA_IN signal (data signal outputted from the NAND memory 2). The DATA_IN signal can be latched as valid data by the DLL 11 delaying the DQS_IN signal at the appropriate delay amount and generating the DQS_IN_D signal. By the way, FIG. 2 illustrates an example of a case of reading data by the toggle mode. In the case of the toggle mode, it is preferable that the memory controller 1 includes a DLL (corresponding to the DLL 11 of FIG. 1) for adjusting a rising timing of the DQS_IN signal and a DLL for adjusting a trailing timing of the DQS_IN signal, where the rising timing and the trailing timing can be adjusted independently. By being provided with the two DLLs for the rising timing adjustment and for the trailing timing adjustment, timing adjustment at a finer degree becomes possible.

An operation that the delay amount adjustment circuit 12 adjusts the delay amount that the DLL 11 is to give to the DQS_IN signal will be described in detail. By the way, in either the case of reading the data by the toggle mode or in a case that is not, the adjustment of the delay amount can be performed with similar procedures.

The delay amount adjustment circuit 12 determines whether the adjustment of the delay amount that the DLL 11 is to give to the DQS_IN signal is necessary or not by confirming whether the data latched by the latch circuit 13 is correct at a predetermined timing. For example, a host apparatus (for example, a portable terminal apparatus and the like) that controls the memory controller 1 issues an instruction command (hereinbelow referred to as a DQS check command) for checking the DQS_ID_D signal to the memory controller 1 at an initial setting of the apparatus, or periodically. The memory controller 1 that received the DQS check command confirms whether an adjustment of a phase (rising timing and trailing timing) of the DQS_ID_D signal is necessary or not. Specifically, the memory controller 1 and the NAND memory 2 transition to a DQS check mode, and the NAND memory 2 starts outputting fixed data for the phase check. In the memory controller 1, the latch circuit 13 latches the output data from the NAND memory 2 at the timing in accordance with the DQS_IN_D signal, and the delay amount adjustment circuit 12 compares read data that is the data latched by the latch circuit 13 with data for comparison (reference data). If the read data and the data for comparison match, it is determined that the phase adjustment of the DQS_ID_D signal is not necessary since the data readout has succeeded, and it is determined that the phase adjustment of the DQS_ID_D signal is necessary if the data do not match. Here, the data for comparison is data that is identical to the fixed data for the phase check that the NAND memory 2 retains, and the delay amount adjustment circuit 12 for example receives a result of the latch circuit 13 predetermined reading identification information (ID) of the NAND memory 1 at low speed, and stores the same in an internal register (not illustrated). Such may be stored in a predetermined storage region (for example, register) within the memory controller 1 upon shipping from a factory. The fixed data for the phase check and the data for comparison may have any configuration so long as they are data patterns by which the necessity of the phase adjustment of the DQS_ID_D signal can be determined.

In determining that the phase adjustment of the DQS_ID_D signal is necessary, the delay amount adjustment circuit 12 adjusts the delay amount that the DLL 11 gives to the DQS_IN signal and optimizes the same. For example, the delay amount adjustment circuit 12 firstly instructs the DLL 11 to set the delay amount to be given to the DQS_IN signal at 0, and further instructs the NAND memory 2 to output the fixed data for the phase check directly or indirectly. Then, it confirms whether the fixed data latched by the latch circuit 13 and the data for comparison match. If the match is confirmed, it is determined that the data readout at the delay amount instructed to the DLL 11 has succeeded. The delay amount adjustment circuit 12 then instructs the DLL 11 to set the delay amount to be given to the DQS_IN signal at 0.1 ns, and further instructs the NAND memory 2 to output the fixed data for the phase check directly or indirectly. Then, it confirms whether the fixed data latched by the latch circuit 13 and the data for comparison match. The delay amount adjustment circuit 12 then instructs the DLL 11 to set the delay amount to be given to the DQS_IN signal at 0.2 ns, and further instructs the NAND memory 2 to output the fixed data for the phase check directly or indirectly. Then, it confirms whether the fixed data latched by the latch circuit 13 and the data for comparison match. Hereinbelow, similar operations arE repeated for a predetermined number of times. Accordingly, the delay amount adjustment circuit 12 confirms whether the data readout from the NAND memory 2 succeeds in each of the cases where the respective delay amounts are used while causing the delay amount that the DLL 11 gives to the DQS_IN signal to change by a certain amount (which is 0.1 ns in this example). As a result, since a maximum value and a minimum value (both critical values of the valid period) of the delay amount by which the data readout succeeds are found, the delay amount adjustment circuit 12 determines a median of the maximum value and the minimum value (a value at a center of the valid period) as the appropriate delay amount. Then, it notifies the determined delay amount to the DLL 11, and instructs to set the same as the delay amount to be given to the DQS_IN signal.

The appropriate delay amount determined by the delay amount adjustment circuit 12 may for example be stored in a predetermined region in the NAND memory 2. In this case, the delay amount adjustment circuit 12 reads the appropriate delay amount upon startup of the apparatus, and instructs the DLL 11 to use the read delay amount.

In the above description of the operation, the storage device confirms the necessity of the adjustment of the delay amount (phase of the DQS_IN_D) when a command is received from the host apparatus, and determines the appropriate delay amount when the necessity is positively determined; however, the storage device may determine the necessity of the delay amount adjustment at its unique timing. For example, the necessity of the delay amount adjustment may be determined after the startup of the apparatus.

Accordingly, in the storage device of the embodiment, the memory controller 1 confirms whether the data readout from the NAND memory 2 can correctly be performed when a predetermined condition is satisfied, for example when a request is received from the host apparatus, and adjusts the phase of the DQS_IN_D signal that is to be the reference of the timing to latch the data outputted from the NAND memory 2, that is, the delay amount for delaying the DQS_IN signal in the event when the data readout has failed. Due to this, the appropriate latch timing of the output data can be maintained even when an operational environment such as a peripheral temperature or an operation voltage of the storage device changes, and reliability of the apparatus improves.

Second Embodiment

Figure 3:
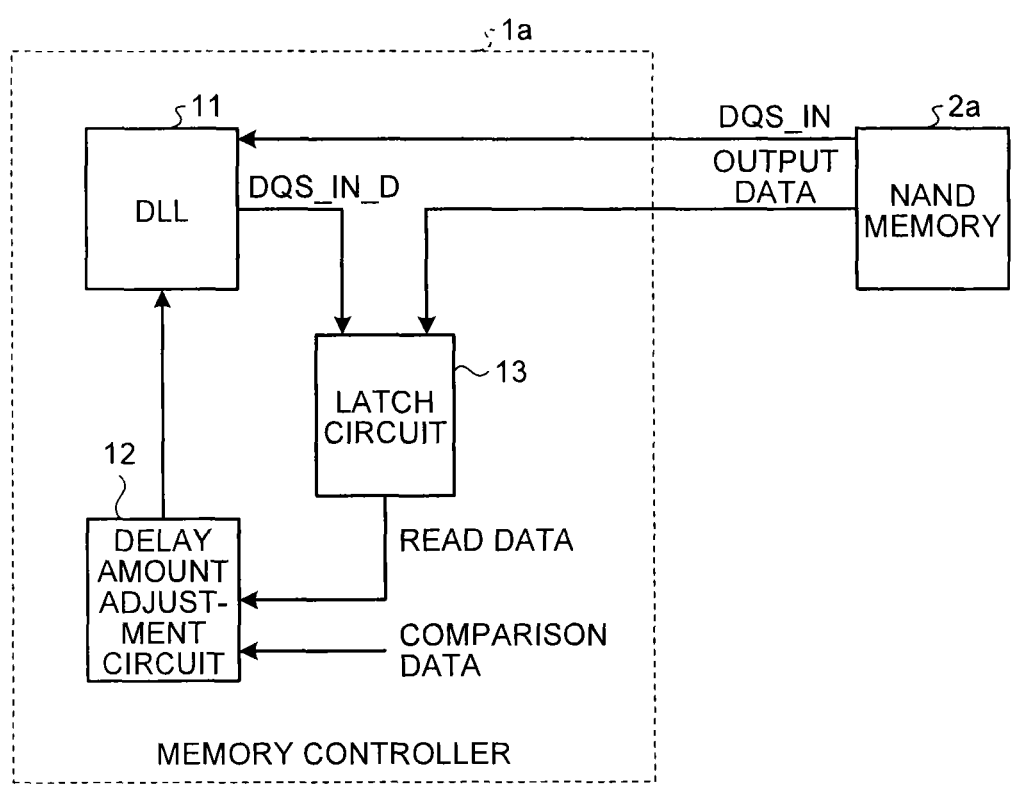
FIG. 3 is a diagram illustrating a configuration example of a storage device of a second embodiment.

FIG. 3 is a diagram illustrating a configuration example of a storage device of the second embodiment. The storage device of the embodiment includes a memory controller 1a and NAND memory 2a. As illustrated in FIG. 3, in the storage device of the embodiment, the NAND memory 2a outputs a DQS_IN signal that is synchronized with a data signal upon outputting data, and the memory controller 1a latches the output data from the NAND memory 2a at a timing based on the DQS_IN signal outputted from the NAND memory 2a.

As is apparent from comparing FIG. 3 and FIG. 1, a difference between the storage device of the embodiment the storage device of the first embodiment resides in whether the DQS_IN signal is generated by the NAND memory 2a or not. The NAND memory 2a outputs the DQS_IN signal during the data output. Due to this, the memory controller 1a is configured by omitting the AND circuit 14 from the memory controller 1 of the storage device of the first embodiment. A DLL 11, a delay amount adjustment circuit 12, and a latch circuit 13 of the memory controller 1a are same as the DLL 11, the delay amount adjustment circuit 12, and the latch circuit 13 of the memory controller 1 described in the first embodiment. Due to this, descriptions on operations of the respective sections of the memory controller 1a will be omitted.

Figure 4:
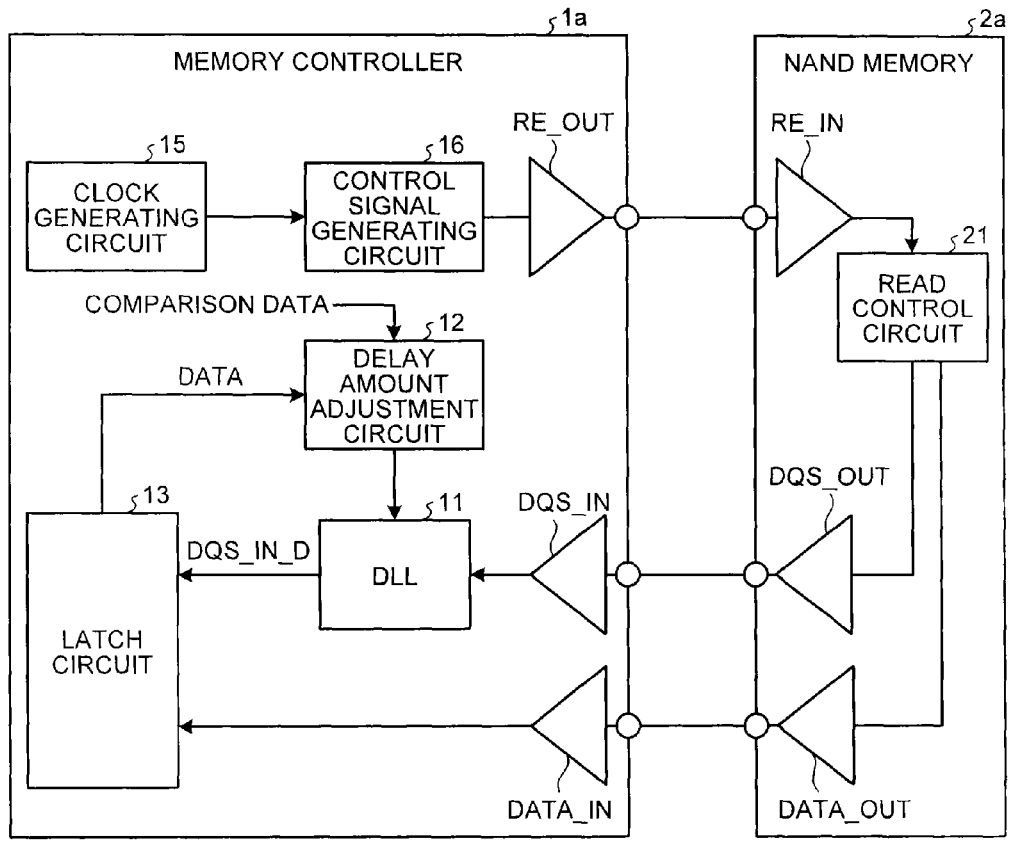
FIG. 4 is a diagram describing an example of a method of generating a DQS_IN signal.

In the storage device of the embodiment, for example, the DQS_IN signal is generated as illustrated in FIG. 4. That is, in the memory controller 1a, a clock generating circuit 15 which was omitted from FIG. 3 generates a clock signal, and a control signal generating circuit 16 generates and outputs an RE_OUT signal as a control signal based on the clock signal. The NAND memory 2a receives the RE_OUT signal outputted by the memory controller 1a as an RE_IN signal, and a read control circuit 21 that was omitted from FIG. 3 generates and outputs a DQS_OUT signal corresponding to the DQS_IN signal of the memory controller 1a, and outputs the data signal (DATA_OUT signal) synchronizes with the DQS_OUT signal, based on the RE_IN signal. That is, when the RE_IN signal is inputted, the read control circuit 21 reads data from a predetermined storage region that is omitted from the drawing, synchronizes the read data with the DQS_OUT signal, and outputs the same as a DATA_OUT signal. Here, the DQS_OUT signal that the read control circuit 21 outputs may be a signal of a same cycle and a same phase as the RE_IN signal, or may be a signal of the same cycle and a different phase. The read control circuit 21 may generate a signal of a different cycle from the RE_IN signal based on the RE_IN signal as the DQS_OUT signal. The DQS_OUT signal is inputted to the memory controller 1a as the DQS_IN signal, and the DATA_OUT signal is inputted as the DATA_IN signal.

Figure 5:
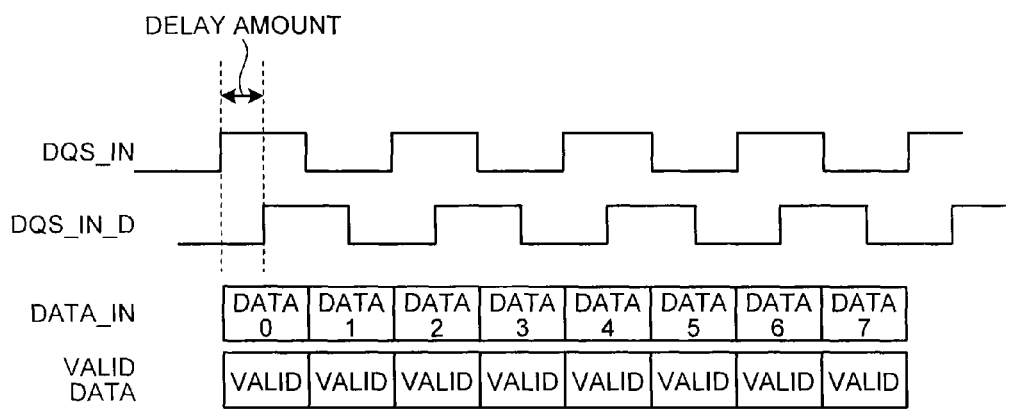
FIG. 5 is a timing chart illustrating a relationship of a DQS_IN signal, a DQS_IN_D signal, and a DATA_IN signal in a storage device of the second embodiment.

FIG. 5 is a timing chart illustrating a relationship of the DQS_IN signal, the DQS_IN_D signal, and the DATA_IN signal in the storage device of the second embodiment. In the embodiment, since the NAND memory 2a generates the DQS_IN signal, as illustrated, the DQS_IN signal and the DATA_IN signal are synchronized.

Accordingly, even in a case where the NAND memory 2a is configured to generate the DQS_IN signal, the memory controller 1a determines necessity of a phase adjustment of the DQS_IN_D signal, and can adjust the delay amount for delaying the DQS_IN signal to an appropriate value as needed. Further, since the configuration that the NAND memory 2a generates the DQS_IN signal is similar to that of the conventional storage device, a storage device that is capable of optimizing the phase of the data latch signal (DQS_IN_D signal) according to a used environment can be realized by replacing a memory controller that the conventional storage device was provided with the memory controller 1a illustrated in FIG. 3.

Third Embodiment

Figure 6:
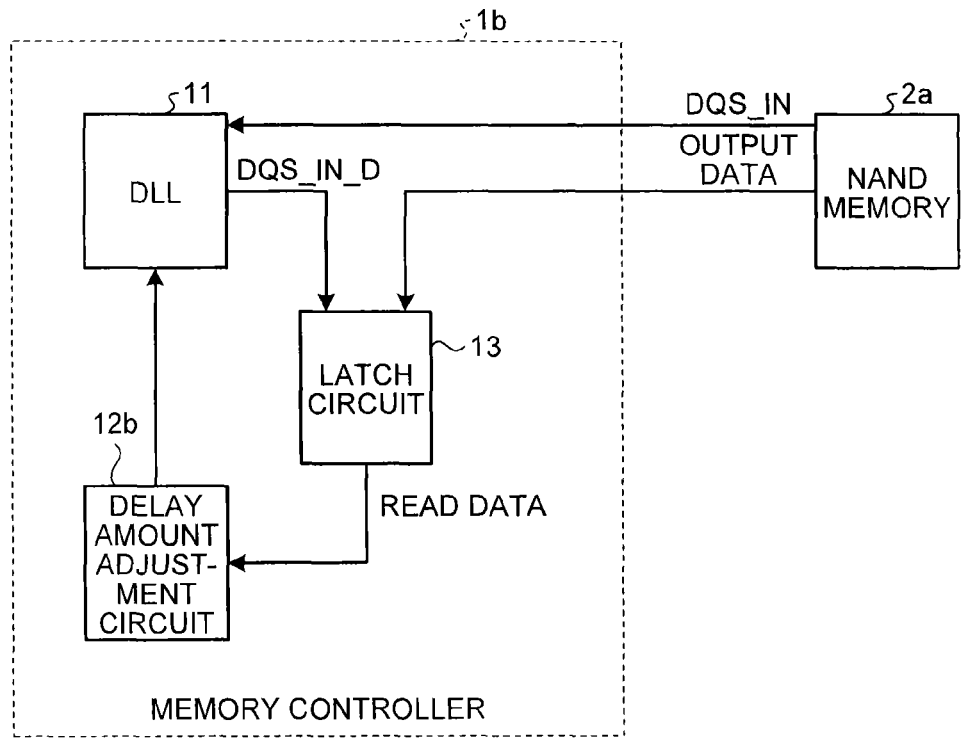
FIG. 6 is a diagram illustrating a configuration example of a storage device of a third embodiment.

FIG. 6 is a diagram illustrating a configuration example of a storage device of the third embodiment. The storage device of the embodiment replaces the memory controller 1a of the storage device of the second embodiment (see FIG. 3) with a memory controller 1b. Further, the memory controller 1b replaces the delay amount adjustment circuit 12 that the memory controller 1a included with a delay amount adjustment circuit 12b.

In the storage devices of the first and second embodiments, the delay amount adjustment circuit 12 determines whether the data readout has succeeded based on whether the data read out from the NAND memory (fixed data for the phase check) matches the data for comparison (fixed data pattern) or not. In this case, if determination accuracy is to be increased, for example, a data length of the data for comparison needs to be lengthened. However, since the data for comparison is prepared in advance and retained by the memory controllers 1, 1a, mounting cost of the memory controllers 1, 1a is increased.

Due to this, in the memory controller 1b of the embodiment, the delay amount adjustment circuit 12b determines whether data readout has succeeded without using data for comparison. Specifically, a data pattern to which an error detection code is added is stored in NAND memory 2a as data for phase check, and the delay amount adjustment circuit 12b reads the data pattern to which the error detection code is added, and determines whether the data readout has succeeded by using the error detection code. As the error detection code, a CRC parity that is only capable of error detection, an ECC parity that is further capable of error correction and the like is used. In the case of using the CRC parity, the delay amount adjustment circuit 12b performs a CRC check on a data pattern portion within the data for phase check read from the NAND memory 2a, and determines that the data readout has succeeded if all of syndromes are "0". For example, fixed data pattern of 256 Bytes is read, and a determination is made such that a phase of DQS_IN_D is appropriate if all of the 256 Bytes can be read correctly, and the phase is inappropriate (adjustment is necessary) if not.

In the case of determining that the phase of the DQS_IN_D is inappropriate, the delay amount adjustment circuit 12b adjusts the phase of the DQS_IN_D (delay amount that a DLL 11 is to give to a DQS_IN signal) in a similar procedure as the delay amount adjustment circuit 12 described in the first embodiment. A difference between the adjustment operation by the delay amount adjustment circuit 12 and the adjustment operation by the delay amount adjustment circuit 12b is that the determination on whether the data readout has succeeded is performed by confirming whether the read data matches the data for comparison (reference data), or is performed by the parity check.

In the storage device of the embodiment, since whether the data readout has succeeded is determined by using the error detection code, a highly accurate determination can be realized at low cost.

By the way, in the embodiment, although a case of performing the determination of the data readout result in the storage device of the second embodiment by using the error detection code has been described, similarly in the storage device of the first embodiment, the determination of the data readout result can be performed by using the error detection code.

Fourth Embodiment

Figure 7:
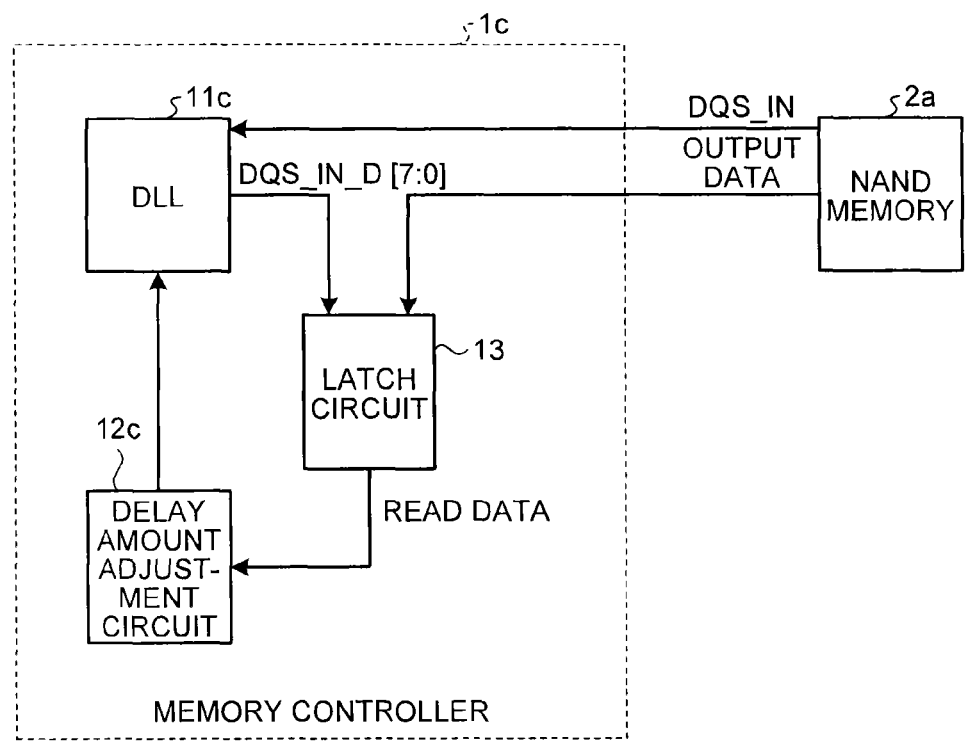
FIG. 7 is a diagram illustrating a configuration example of a storage device of a fourth embodiment.

FIG. 7 is a diagram illustrating a configuration example of a storage device of the fourth embodiment. The storage device of the embodiment replaces the memory controller 1b of the storage device of the third embodiment (see FIG. 6) with a memory controller 1c. Further, the memory controller 1c replaces the DLL 11 and the delay amount adjustment circuit 12b included in the memory controller 1b with a DLL 11c and a delay amount adjustment circuit 12c.

In a case where a plurality of data buses exists, if a data transfer speed is made fast, delay variations among the data buses that had conventionally been ignorable influence data readout performance. For example, in a case where the data bus is 8 bits, there are possibilities that a part of the bits cannot be read out properly even if a delay amount to be given to a DQS_IN signal is adjusted. The storage device of the embodiment resolves problems caused by delay variations by adjusting the phase of the data latch signal (DQS_IN_D) for each of the data buses. That is, the delay amount adjustment circuit 12c of the memory controller 1c optimizes a delay amount for the DLL 11c to delay the DQS_IN signal for each bit of the data bus. When the data readout fails, the delay amount adjustment circuit 12c specifies a bit that caused a readout error, and adjusts the phase of the data latch signal corresponding to this bit. The method of adjusting the phase is similar to the phase adjustment method of the delay amount adjustment circuit 12b in the memory controller 1b described in the third embodiment. In the delay amount adjustment circuit 12b, the phase of the DQS_IN_D signal (timing to latch bits of each data) is changed over plural times without distinguishing the bits, and determined the optimal phase by trying the data readout after each change, however, the delay amount adjustment circuit 12c changes the phase of the DQS_IN_D signal corresponding to the bit that caused the readout error (timing to latch the bit that had caused the readout error) over plural times, and determines the optimal phase (phase corresponding to the bit that had caused the readout error) by trying the data readout after each change.

Variation information may be acquired by an ECC, and variation may be corrected based on the information. For example, a BCH (Bose-Chaudhuri-Hocquenghem) code is inserted as the ECC. In this case, if an error is generated in a specific bit within the bus 8 bits, it can be determined that the aforesaid bit has a phase displaced from other bits. An RS (Reed-Solomon) code may be used, where an error position and error value information are acquired to more effectively perform the correction. The aforementioned function may be realized by using an existing normal ECC function for data protection.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device, comprising:
   a storage medium;
   a DLL circuit that gives a predetermined amount of delay to an inputted clock signal;
   a latch circuit that latches data outputted from the storage medium according to the clock signal delayed by the DLL circuit; and
   a delay amount adjustment circuit that adjusts the delay amount that the DLL circuit is to give to the clock signal based on a latch result by the latch circuit, wherein
   the delay amount adjustment circuit confirms whether a latch timing by the latch circuit is normal or not based on a result of the latch circuit latching predetermined data series, and, in a case where the latch timing is abnormal, the delay amount adjustment circuit adjusts the delay amount over a plurality of times, confirms whether each latch timing corresponding to each delay amount after the adjustment is normal or not based on a result of the latch circuit latching the predetermined data series based on each delay amount after the adjustment, and selects a median of the delay amounts asserting normal latch timings as a final delay amount after the adjustment.

2. The storage device according to claim 1, wherein
   a known data pattern is used as the predetermined data series, and
   the delay amount adjustment circuit determines whether the latch timing is normal or not based on a comparison result of a result of the latch circuit latching the data pattern and data for comparison that is retained in advance.

3. The storage device according to claim 2, wherein the delay amount adjustment circuit uses data, which is read by the latch circuit latching the data pattern that the storage medium outputted at a low speed, as the data for comparison.

4. The storage device according to claim 1, wherein
   a series in which an error detection code is added to data is used as the predetermined data series, and
   the delay amount adjustment circuit determines whether the latch timing is normal or not based on a result of the latch circuit latching the series in which the error detection code is added to the data.

5. The storage device according to claim 4, wherein a CRC parity is used as the error detection code.

6. The storage device according to claim 4, wherein an ECC parity is used as the error detection code.

7. The storage device according to claim 1, wherein the delay amount adjustment circuit periodically confirms whether the latch timing by the latch circuit is normal or not.

8. The storage device according to claim 1, wherein the delay amount adjustment circuit confirms whether the latch timing by the latch circuit is normal or not when a request is made from a host apparatus.

9. The storage device according to claim 1, wherein the delay amount adjustment circuit confirms whether the latch timing by the latch circuit is normal or not after startup.

10. The storage device according to claim 1, wherein
    the DLL circuit receives the clock signal from the storage medium, and
    the storage medium outputs data by synchronizing the data to the clock signal.

11. The storage device according to claim 1, wherein the delay amount adjustment circuit determines whether the latch circuit is latching data outputted from a data bus of the storage medium for each of data buses, and in a case where there is a data bus that is not latching at a normal timing, the delay amount adjustment circuit adjusts the delay amount so that a latch timing for the data bus becomes correct.

12. A data latch timing adjustment method for a storage device including:
   a storage medium,
   a DLL circuit that gives a predetermined amount of delay to an inputted clock signal,
   a latch circuit that latches data outputted from the storage medium according to the clock signal delayed by the DLL circuit, and
   a delay amount adjustment circuit that adjusts the delay amount that the DLL circuit is to give to the clock signal based on a latch result by the latch circuit, the method being configured to adjust a latch timing by the delay amount adjustment circuit adjusting the delay amount, the method comprising:
   a confirmation data outputting step of the storage medium outputting predetermined data series for confirming the latch timing;
   a data latching step of the latch circuit latching the predetermined data series;
   a determining step of the delay amount adjustment circuit determining whether the adjustment of the latch timing is necessary or not based on a latch result of the predetermined data series; and
   an adjusting step of the delay amount adjustment circuit adjusting the delay amount in a case where the adjustment of the latch timing is necessary.

13. The data latch timing adjustment method according to claim 12, wherein
   a known data pattern is used as the predetermined data series, and
   in the determining step, whether the adjustment of the latch timing is necessary or not is determined based on a comparison result of the latch result in the data latching step and data for comparison that is retained in advance.

14. The data latch timing adjustment method according to claim 12, wherein
   a series in which an error detection code is added to data is used as the predetermined data series, and
   in the determining step, a determination that the adjustment of the latch timing is necessary is made in a case where an error exists in the latch result in the data latching step.

15. The data latch timing adjustment method according to claim 14, wherein a CRC parity is used as the error detection code.

16. The data latch timing adjustment method according to claim 14, wherein an ECC parity is used as the error detection code.

17. The data latch timing adjustment method according to claim 12, wherein
   the confirmation data outputting step, the data latching step, and the determining step are executed periodically, and
   the adjusting step is executed in a case where a determination that the adjustment of the latch timing is necessary is made in the determining step.

18. The data latch timing adjustment method according to claim 12, wherein
   the confirmation data outputting step, the data latching step, and the determining step are executed in a case where a request is made from a host apparatus, and
   the adjusting step is executed in a case where a determination that the adjustment of the latch timing is necessary is made in the determining step.

19. The data latch timing adjustment method according to claim 12, wherein
   the confirmation data outputting step, the data latching step, and the determining step are executed after startup, and
   the adjusting step is executed in a case where a determination that the adjustment of the latch timing is necessary is made in the determining step.

* * * * *